United States Patent [19]

Goldman

[11] 4,211,563

[45] Jul. 8, 1980

[54] AQUEOUS PHOTORESIST OF CASEIN AND N-METHYLOL ACRYLAMIDE

[75] Inventor: Abraham Goldman, Kendall Park, N.J.

[73] Assignee: RCA Corporation, New York, N.Y.

[21] Appl. No.: 23,391

[22] Filed: Mar. 23, 1979

Related U.S. Application Data

[62] Division of Ser. No. 877,481, Feb. 13, 1978, Pat. No. 4,158,566.

[51] Int. Cl.$^2$ .......................... G03C 1/68; G03C 1/66
[52] U.S. Cl. .................................... 430/286; 106/138; 430/289; 430/495; 430/643
[58] Field of Search ................ 96/115 R, 115 P, 36.1, 96/36.2, 114.9, 114.4, 93, 75, 38, 49, 35.1, 88; 106/124, 138, 147; 260/112 R, 119

[56] References Cited

U.S. PATENT DOCUMENTS

| | | | |
|---|---|---|---|
| 2,324,197 | 7/1943 | Danehy | 96/33 |
| 2,324,198 | 7/1943 | Danehy et al. | 96/33 |
| 2,387,056 | 10/1945 | Buck et al. | 96/33 |
| 2,624,672 | 1/1953 | Frost et al. | 96/33 |
| 2,687,958 | 8/1954 | Neugebauer | 96/93 X |
| 2,822,280 | 2/1958 | Martin et al. | 106/146 |
| 2,921,852 | 1/1960 | Caton | 96/93 |
| 3,658,538 | 4/1972 | Hilhorst | 96/75 |
| 3,745,011 | 7/1973 | Hudgin | 96/88 |
| 3,795,640 | 3/1974 | Pande et al. | 96/115 R X |
| 4,061,529 | 12/1977 | Goldman et al. | 156/644 |

*Primary Examiner*—Edward C. Kimlin
*Attorney, Agent, or Firm*—Birgit E. Morris; Edward J. Sites

[57] ABSTRACT

The addition of N-methylol acrylamide as an accelerator to casein-based aqueous photoresist compositions reduces the baking temperature required to render the developed resist etch resistant.

4 Claims, No Drawings

AQUEOUS PHOTORESIST OF CASEIN AND N-METHYLOL ACRYLAMIDE

This is a division of application Ser. No. 877,481, filed 2-13-78, now U.S. Pat. No. 4,158,566.

This invention relates to a water based photoresist composition. More particularly, this invention relates to an aqueous photoresist composition which is curable at low temperatures.

BACKGROUND OF THE INVENTION

Water based photoresists based on natural products such as fish glue, albumin and casein, have been known for a number of years. A useful photoresist composition comprises casein, made by acid precipitation of milk, an alkali metal base to impart a pH of 7.7 or higher which improves the solubility of the natural product in water, and an ammonium dichromate sensitizer.

U.S. Pat. No. 4,061,529 of Goldman and Datta, herein incorporated by reference, discloses the addition of sodium borate as the base in a concentration so that the resist solution has a final pH of 6.7–7.3, to improve the pot life of the coating composition and the shelf life of coated substrates.

These resists have been employed extensively in the lithographic printing arts and in the manufacture of shadow masks for television monitors. A cleaned metal surface or substrate is coated with the aqueous photoresist and dried. A mask having a desired pattern is contacted to the resist and exposed to ultraviolet light which hardens the resist in the exposed areas. The resist film is then washed with water to dissolve the unexposed resist and thereby uncover part of the metal substrate. The now partially coated substrate is then dried and baked for about 5 minutes at a temperature of from 500°–550° F. (260°–287° C.). This step is required to render the remaining photoresist etch resistant. The partially coated substrate is then etched by spraying with hot ferric chloride solution which etches away the bared metal portions. The residual resist can then be removed in hot alkali solution.

The above process has been universally adopted for television shadow mask production because of its low cost, e.g., the photoresist, water rinse and caustic wash solutions are very inexpensive as compared to organic based photoresists.

However, this process has certain limitations which prevent its use in other high production manufacture which employ lithographic techniques. In particular, in the manufacture of printed circuit boards, a copper clad phenolic impregnated paper board is etched to form a pattern of conductors to which various components are soldered.

Generally, printed circuit boards are made by screen printing an etch resistant ink onto the boards and etching the exposed metal areas. However, this method is not able to define line widths of less than about 0.025 inch (0.06 cm). With the increasing miniaturization of components on printed circuit boards, the need to define line widths and spacings on the order of 0.015 inch (0.04 cm) and smaller has occurred. Photolithographic techniques to define such fine pattern spacings must then be employed.

The pattern is made up by applying a photoresist film over the copper layer, exposing and developing the resist to create a pattern of photoresist and exposed copper. The copper is etched away in the exposed areas and the photoresist is then removed, leaving a patterned copper layer on the board. At present, organic based photoresists are used because the high temperatures required to cure water based resists cannot be tolerated by the phenolic impregnated paper substrate.

The water based photoresists have other deficiencies as well for this application; they are subject to premature hardening, called dark hardening, particularly under high humidity conditions, and they have a limited shelf life.

Thus an inexpensive, sensitive water based photoresist having low cure temperatures and improved shelf life would be highly desirable for defining fine patterns on printed circuit boards.

SUMMARY OF THE INVENTION

I have found that the addition of an accelerator, N-methylol acrylamide, to casein based photoresist compositions lowers the curing temperatures required for etch resistance and enables them to be employed in printed circuit board manufacture. In addition, the accelerator improves the sensitivity of the photoresist, reducing overall energy requirements, and improves the shelf life of the resists.

DETAILED DESCRIPTION OF THE INVENTION

The improved photoresist compositions of the invention comprise an aqueous solution of casein as the sensitizable protein, sodium borate as the base in an amount of from about 8–20 percent by weight of the casein and also so that the final pH of the solution is from about 6.7–7.3; from about 2–20 percent by weight of the casein of a dichromate salt sensitizer and from about 5–30 percent by weight of the casein of N-methylol acrylamide accelerator. Optionally a small amount of a surfactant can also be added.

Any acid precipitated casein can be employed. Casein, because it is a natural product, may differ somewhat from one batch to another depending on its sources and also the choice of precipitating agent, which can be lactic acid, nitric acid, hydrochloric acid, sulfuric acid and the like; thus some difference in behavior of the casein product may be noted and suitable adjustments can be made therefor. The casein comprises about 4–12 percent by weight of the photoresist composition.

An alkalizing agent must be added to solubilize the casein and is added in sufficient amount so that the pH of the final photoresist solution is from about 6.7–7.3. It is believed the use of sodium borate as the alkalizing agent is advantageous in that it does not degrade the casein and retards the curing of the photoresist composition, thereby improving shelf life. Generally amounts of from about 8–20 percent by weight of the casein is sufficient, 1ut additional amounts may be required to bring the pH to the desired level.

A dichromate sensitizer is also required. Sodium dichromate is the sensitizer presently preferred, since it reduces dark hardening over other casein photoresists, although ammonium or potassium dichromate can also be employed. The sensitizer is added in amounts of from about 5–30 percent by weight of the casein present.

N-methylol acrylamide has the formula

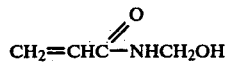

Additions of from about 5–30 percent by weight of the casein present of the accelerator are generally added. The addition of the accelerator enables the casein photoresist of the present invention to be cured at much lower temperatures after ultraviolet light exposure than conventional casein photoresists. The accelerator also imparts resistance to high humidity. The total energy requirements for exposure and curing are also substantially reduced over that required for conventional casein photoresists.

The amount of water added is adjusted to regulate the viscosity and the thickness of the resultant photoresist coating. The thickness of the resist layer should be less than about 3 microns, preferably about 1–2.5 microns so that the layer remains transparent to the exposure light. The viscosity of the photoresist solution will be varied also depending on the choice of applying the solution.

A small amount of a surfactant can also be added. Suitable surfactants include Igepal, commercially available from GAF Corporation; Triton X-100, a product of Rohm & Haas Co.; or Sulframin 4010, commercially available from Witco Chemical Company. A bactericide such as phenol or Dowicide G-ST of Dow Chemical Company, can be added also if desired.

The photoresist compositions of the invention can be prepared by heating deionized water to about 50°–60° C. and dissolving the sodium borate and surfactant. The casein is then added in a small but steady stream with vigorous agitation until dissolved; usually about 30–40 minutes is sufficient. The resultant solution is then cooled to room temperature and filtered.

Just prior to use, the chromate salt sensitizer is added and the pH adjusted, if required, with sodium borate. The N-methylol acrylamide accelerator is then added.

The photoresist compositions of the invention can be applied by dipping, spin coating, roller coating and the like. The resists are dried under infrared light and exposed to an ultraviolet light source, such as a carbon-arc, xenon or a mercury lamp through a mask. This hardens the coating in the exposed areas. The resist is developed by flushing with water which removes the unexposed portions of the resist, forming the desired pattern on the substrate. The photoresist is then baked at a temperature below about 150° C., preferably about 125°–135° C., for about 10 minutes in air to make the resist etch resistant. The exposed portions of the substrate are then etched with a suitable etchant. When the exposed metal is copper, a suitable etchant includes ferric chloride solution. The remaining photoresist is removed with a warm dilute basic solution, e.g., aqueous 5–10 percent by weight sodium hydroxide at 50°–80° C.

The invention will be further illustrated by the following Examples but it is to be understood that the invention is not meant to be limited to the details described therein. In the Examples, parts and percentages are by weight. The sensitivity of the photoresist was measured using the Stouffer step wedge technique developed by the Stouffer Graphic Arts Equipment Company. The step wedge has a scale from 1–21 and has an increased density of 0.15 per step.

EXAMPLES 1–3

Several batches of casein photoresist were made by adding 1.32 parts of sodium borate to 100 parts of water, then stirring in 8 parts of casein. The initial pH was measured. 0.8 Part of ammonium dichromate was added and the final pH measured. Varying amounts of N-methylol acrylamide accelerator were then added as detailed below.

The photoresist was applied by spinning onto a substrate to a thickness of about 4 microns. The photoresist was exposed to ultraviolet light and washed with water. The sensitivity was measured using the Stouffer step wedge after 90 seconds and after 120 seconds exposure. The results are tabulated below. The control photoresist composition contained no N-methylol acrylamide and had a thickness of about 2.5 microns.

| Examples | Initial pH | Ratio NMA/ casein | Final pH | Sensitivity 90 secs. | 120 secs. |
|---|---|---|---|---|---|
| 1 | 8.43 | 15% | 7.35 | 4 | 5 |
| 2 | 8.34 | 20% | 7.28 | 6–7 | 7–8 |
| 3 | 8.27 | 25% | 7.21 | 8 | 9 |
| Control | 8.55 | — | 7.28 | 2* | 4 |

*100 seconds exposure

Thus the present photoresists have improved sensitivity.

EXAMPLE 4

Photoresists as in Example 1 were compared to a control casein photoresist to determine sensitivity and shelf life. The control photoresist was prepared from 6.6 parts of sodium caseinate, 0.6 part of sodium borate, 1.3 parts of ammonium dichromate, 0.1 part of surfactant and 92 parts of deionized water. This photoresist had a final pH of 6.65.

The sensitivity data is summarized below:

| | 60 secs. | 90 secs. | 105 secs. |
|---|---|---|---|
| Control | 0 | 2 | 3 |
| Example 4 | 5 | 6–7 | 7 |

The samples were coated onto 6″ by 6″ (15.2×15.2 cm) panels and dried under an infrared lamp. Half of the panels were exposed to a temperature of 75° C. for 2.5 minutes and the sensitivity remeasured as summarized below:

| | 60 secs. | 90 secs. | 105 secs. |
|---|---|---|---|
| Control | 2 | 4 | 5–6 |
| Example 4 | 5 | 6 | 6 |

The samples were then allowed to remain at ambient conditions for 24 hours. The sensitivity was remeasured as summarized below:

| | 60 secs. | 90 secs. | 105 secs. |
|---|---|---|---|
| Control | 14–5 | 16–17 | 15–16 |
| Example 4 | 9 | 10 | 11 |

Thus the addition of the present accelerator increases the sensitivity to light of casein resists, even after heating, but decreases the dark hardening due to humidity and thus increases the shelf life.

EXAMPLE 5

A photoresist composition was prepared as in Example 1 from 100 parts of deionized water, 6.6 parts of casein, 1.4 parts of sodium borate, 1.0 part of N-methylol acrylamide, 0.33 part of sodium dichromate and 0.07 part of Triton X-100 surfactant. The final pH was 7.3.

The sensitivity was measured as in Example 4. The samples were stored at 68 percent RH for 20 hours and remeasured. The data are summarized below:

|  | 75 secs. | 105 secs. |
|---|---|---|
| Example 5 | 3 | 4 |
| Example 5 after 20 hrs. | 5 | 8 |

Thus little dark hardening occurred, even after high humidity storage.

EXAMPLE 6

A photoresist composition was prepared from 100 parts of deionized water, 7 parts of casein, 1.4 parts of sodium borate ($NaB_2O_3 \cdot 10H_2O$), 0.5 part of ammonium dichromate, 1.0 part of N-methylol acrylamide and 0.07 part of Triton X-100 surfactant, as in Example 1.

The above composition was dip coated onto copper clad phenolic paper panels 18 by 24 inches (45.7 by 61 cm) and exposed to ultraviolet light through a mask. The panels were developed, baked at 130° C for 3 minutes and etched with ferric chloride solution.

Excellent resolution of fine copper patterns was obtained.

I claim:

1. A photoresist composition comprising an aqueous solution containing from about 4–12 percent by weight of the composition of casein, sodium borate in an amount of from about 8–20 percent by weight of the casein and so that the final pH is from about 6.7 to 7.3; from about 2–20 percent by weight of the casein of a dichromate salt and from about 5–30 percent by weight of the casein of N-methylol acrylamide.

2. A photoresist composition according to claim 1 further including a surfactant.

3. A photoresist composition according to claim 1 wherein the dichromate is ammonium dichromate or sodium dichromate.

4. In an aqueous photoresist composition comprising about 4–12 percent by weight of the composition of an acid precipitated casein, a sodium borate alkalizer in an amount from about 8–20 percent by weight of the casein, and from about 2–20 percent by weight of the casein of a dichromate sensitizer, the improvement which comprises adding from about 5–30 percent by weight of the casein of N-methylol acrylamide.

* * * * *